United States Patent
Venkatramani (10) Patent No.: US 8,190,966 B1
(45) Date of Patent: May 29, 2012

(54) SYSTEMS AND METHODS FOR IMPLEMENTING END-TO-END CHECKSUM

(75) Inventor: Anjan Venkatramani, Mountain View, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 1135 days.

(21) Appl. No.: 11/852,548

(22) Filed: Sep. 10, 2007

Related U.S. Application Data (63) Continuation of application No. 10/128,255, filed on Apr. 24, 2002, now Pat. No. 7,284,181.

(51) Int. Cl.
 *H03M 13/00* (2006.01)

(52) U.S. Cl. .......................... 714/758; 714/776; 714/753

(58) Field of Classification Search .................. 714/758, 714/776, 748, 807, 753, 763
 See application file for complete search history.

(56) References Cited

U.S. PATENT DOCUMENTS

| | | | | |
|---|---|---|---|---|
| 4,384,353 A | * | 5/1983 | Varshney | ....................... 714/763 |
| 4,654,480 A | | 3/1987 | Weiss | |
| 4,686,625 A | * | 8/1987 | Bryan | ............................... 702/6 |
| 4,807,260 A | * | 2/1989 | Solina | ........................... 375/333 |
| 5,430,842 A | | 7/1995 | Thompson et al. | |
| 5,475,540 A | | 12/1995 | Gold | |
| 5,491,802 A | | 2/1996 | Thompson et al. | |
| 5,583,859 A | | 12/1996 | Feldmeier | |
| 5,594,869 A | | 1/1997 | Hawe et al. | |
| 5,796,727 A | | 8/1998 | Harrison et al. | |
| 5,815,516 A | | 9/1998 | Aaker et al. | |
| 5,826,032 A | | 10/1998 | Finn et al. | |
| 5,844,918 A | | 12/1998 | Kato | |
| 5,850,515 A | | 12/1998 | Lo et al. | |
| 6,000,006 A | | 12/1999 | Bruce et al. | |
| 6,014,765 A | | 1/2000 | Maeda et al. | |
| 6,044,086 A | | 3/2000 | Albrow et al. | |
| 6,134,665 A | | 10/2000 | Klein et al. | |
| 6,141,698 A | | 10/2000 | Krishnan et al. | |
| 6,145,102 A | | 11/2000 | Klein et al. | |
| 6,233,258 B1 | | 5/2001 | Kanehara | |
| 6,252,888 B1 | * | 6/2001 | Fite et al. | ....................... 370/466 |
| 6,292,516 B1 | | 9/2001 | Petsko et al. | |
| 6,512,751 B1 | | 1/2003 | Struhsaker et al. | |
| 6,771,660 B1 | * | 8/2004 | Bourlas et al. | ................ 370/466 |
| 7,031,343 B1 | * | 4/2006 | Kuo et al. | ...................... 370/473 |
| 7,827,462 B2 | * | 11/2010 | Vogt | .............................. 714/753 |

OTHER PUBLICATIONS

U.S. Appl. No. 10/128,255, filed Apr. 24, 2002.

* cited by examiner

*Primary Examiner* — Fritz Alphonse
(74) *Attorney, Agent, or Firm* — Harrity & Harrity, LLP (57) ABSTRACT

A network device includes input logic and output logic. The input logic receives multiple packets, where each of the multiple packets has a variable length, and generates a first error detection code for one of the received multiple packets. The input logic further fragments the one of the variable length packets into one or more fixed length cells, where the fragmentation produces a cell of the one or more fixed length cells that includes unused overhead bytes that fill up the cell beyond a last portion of the fragmented one of the variable length packets, and selectively inserts the first error detection code into the overhead bytes. The input logic also forwards the one or more fixed length cells towards the output logic of the network device.

19 Claims, 7 Drawing Sheets

SYSTEMS AND METHODS FOR IMPLEMENTING END-TO-END CHECKSUM

RELATED APPLICATION

The present application is a continuation of U.S. application Ser. No. 10/128,255, entitled "Systems and Methods for Implementing End-To-End Checksum" and filed Apr. 24, 2002, the disclosure of which is incorporated by reference herein in its entirety.

BACKGROUND OF THE INVENTION

1. Field of the Invention

The present invention relates generally to data transfer systems, and more particularly, to systems and methods for end-to-end error detection in data transfer systems.

2. Description of Related Art

Conventional networks typically include devices, such as routers, that transfer data from one or more sources to one or more destinations. A packet is one format in which data of variable size can be transmitted through a network. A router is a switching device that receives packets containing data or control information at input ports and, based on destination or other information included in the packets, routes the packets through output ports to the destinations or intermediary destinations. Conventional routers determine the proper output port for a particular packet by evaluating header information included in the packet.

Conventional routers include packet forwarding engines for receiving and forwarding incoming packets to their intended destinations. To forward incoming packets from input port to output port, routers typically must perform complex data manipulation actions that may lead to errors in the packet data. Additionally, storage and operations involved in storing and retrieving packets during the forwarding process can result in data corruption.

Though other error detection mechanisms, such as link cyclical redundancy checks (CRC) or memory error checks, exist to detect local errors, a secondary level of protection that detects packet data errors that may occur in network devices during the forwarding process would be desirable. Therefore, there exists a need for error detection mechanisms that can detect packet data errors that may occur during the packet data manipulation and storage that network devices typically perform during data transfer processes.

SUMMARY OF THE INVENTION

Systems and methods consistent with the principles of the invention address this and other needs by implementing an end-to-end checksum on incoming data received at network devices, such as a router. In one implementation consistent with the principles of the invention, a router detects packet data errors that may occur during complex data manipulations incurred when forwarding a packet from an input port/interface to an output port/interface. Additionally, to implement the end-to-end checksum without increasing bandwidth requirements, systems and methods consistent with the principles of the invention utilize existing and unused packet/cell overhead and/or pad bytes by injecting or "stuffing" a generated checksum into the overhead/pad bytes. Thus, since no additional error detection bytes must be added to a packet/cell for the end-to-end error detection process, no additional demands on available bandwidth are required. The complex data manipulation actions necessary for forwarding received packets from an input port/interface to an output port/interface in a router may therefore be achieved without increasing internal router bandwidth requirements, while providing for error detection.

One aspect consistent with principles of the invention is directed to a network device that includes output logic and input logic. The input logic may be configured to: receive multiple packets, where each of the multiple packets has a variable length, generate a first error detection code for one of the received multiple packets, fragment the one of the variable length packets into one or more fixed length cells, where the fragmentation produces a cell of the one or more fixed length cells that includes unused overhead bytes that fill up the cell beyond a last portion of the fragmented one of the variable length packets, selectively insert the first error detection code into the overhead bytes, and forward the one or more fixed length cells towards the output logic.

A second aspect consistent with principles of the invention is directed to a method that includes receiving multiple packets at an input of a network device, where each of the multiple packets has a variable length and generating an error code for one of the received multiple packets. The method further includes fragmenting the one of the variable length packets into one or more fixed length cells, where the fragmentation produces a cell of the one or more fixed length cells that includes unused overhead bytes that fill up the cell beyond a last portion of the fragmented one of the variable length packets. The method also includes selectively inserting the error code into the overhead bytes; and transferring the one or more fixed length cells to an output of the network device.

A third aspect consistent with principles of the invention is directed to a network device that includes means for receiving multiple data units at an input of a network device, where each of the multiple data units has a variable length and means for generating an error detection code for one of the received multiple data units. The network device further includes means for fragmenting the one of the variable length data units into one or more fixed length cells, where the fragmentation produces a cell of the one or more fixed length cells that includes unused overhead bytes that fill up the cell beyond a last portion of the fragmented one of the variable length data units. The network device also includes means for selectively inserting the first error detection code into the overhead bytes and means for forwarding the one or more fixed length cells towards an output of the network device.

A fourth aspect consistent with principles of the invention is directed to a network device that includes output logic and input logic. The input logic may be configured to: receive a data unit, determine a first error code based on the received data unit, and transfer the data unit through the network device to the output logic. The output logic of the network device is configured to: determine a second error code based on the transferred data unit, and compare the first and second error code to identify data errors in the transferred data unit.

BRIEF DESCRIPTION OF THE DRAWINGS

The accompanying drawings, which are incorporated in and constitute a part of this specification, illustrates embodiments of the invention and, together with the description, explain the invention. In the drawings.

DETAILED DESCRIPTION

The following detailed description of the invention refers to the accompanying drawings. The same reference numbers in different drawings may identify the same or similar elements. Also, the following detailed description does not limit the invention. Instead, the scope of the invention is defined by the appended claims and equivalents.

Systems and methods consistent with the principles of the invention implement an end-to-end network device error detection process for reducing errors that may occur during data transfer processes. Consistent with the principles of the invention, a checksum may be produced based on incoming data and selectively injected, or "stuffed," into non-data bytes that may be transferred with the data through the network device. When the data is received at an outgoing port, the checksum may be extracted and used to determine if any errors were introduced during data manipulations related to the data forwarding process. By "stuffing" the checksum into bytes, such as existing and unused pad or overhead bytes, implementations consistent with the principles of the invention may perform end-to-end error detection within a network device without requiring additional bandwidth.

Exemplary System

Figure 1:
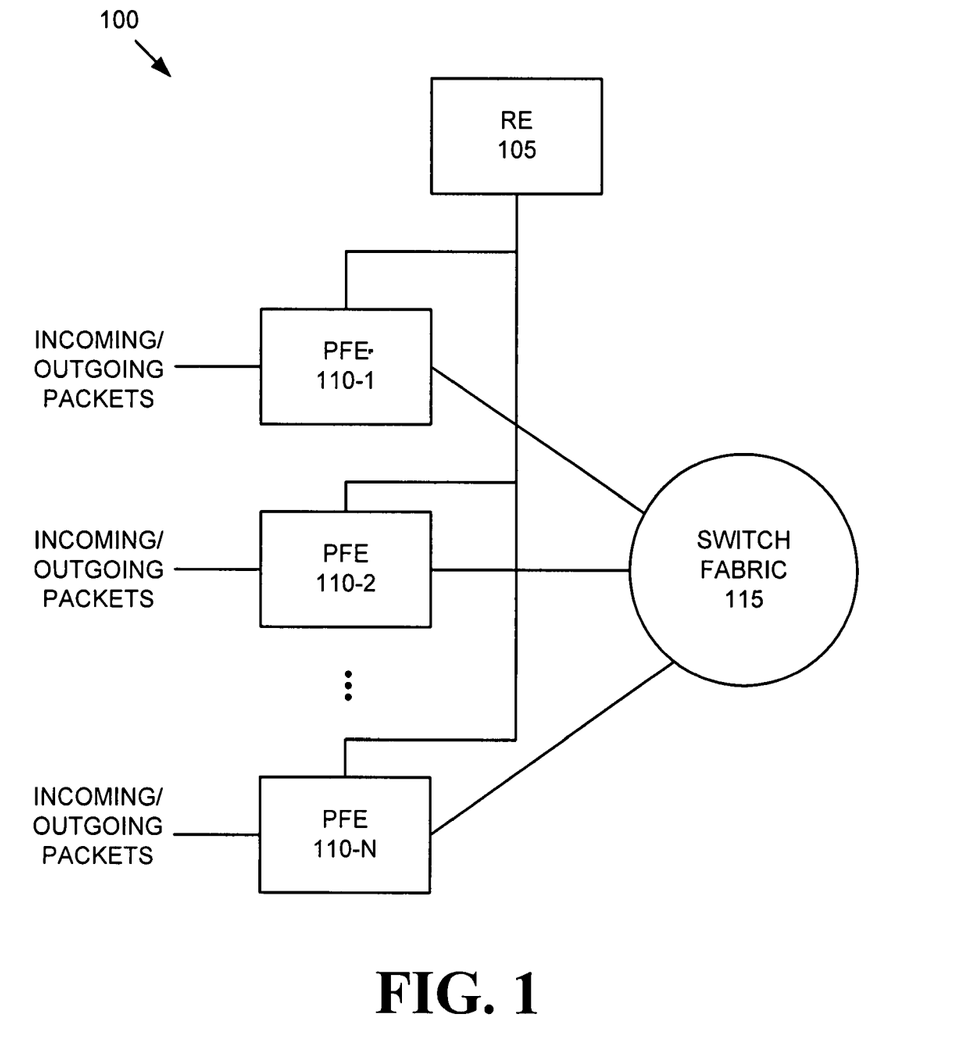
FIG. 1 is a diagram of an exemplary router in which systems and methods consistent with the principles of the invention may be implemented.

FIG. 1 is a diagram of an exemplary router 100 in which systems and methods consistent with the principles of the invention may be implemented. Router 100 may receive one or more packet streams from a physical link, process the stream(s) to determine destination information, and transmit the stream(s) on one or more links in accordance with the destination information. Router 100 represents any network device that may implement systems and methods consistent with the principles of the invention.

Router 100 may include a routing engine (RE) 105 and multiple packet forwarding engines (PFEs) 110-1-110-N interconnected via a switch fabric 115. Switch fabric 115 may include one or more switching planes to facilitate communication between two or more of PFEs 110. In an implementation consistent with the principles of the invention, each of the switching planes may include a three-stage switch of crossbar elements.

RE 105 performs high-level management functions for router 100. For example, RE 105 may communicate with other networks and systems connected to router 100 to exchange information regarding network topology. RE 105 may create routing tables based on network topology information, create forwarding tables based on the routing tables, and send the forwarding tables to PFEs 110. PFEs 110 may use the forwarding tables to perform route lookups for incoming packets. RE 105 may also perform other general control and monitoring functions for router 100.

Each PFE 110-1-110-N connects to RE 105 and switch fabric 115. Each PFE 110-1-110-N receives packets on physical links connected to a network, such as a wide area network (WAN) (not shown). Each physical link could be one of many types of transport media, such as optical fiber or Ethernet cable. The packets on the physical link are formatted according to one of several protocols, such as the synchronous optical network (SONET) standard or Ethernet.

Figure 2:
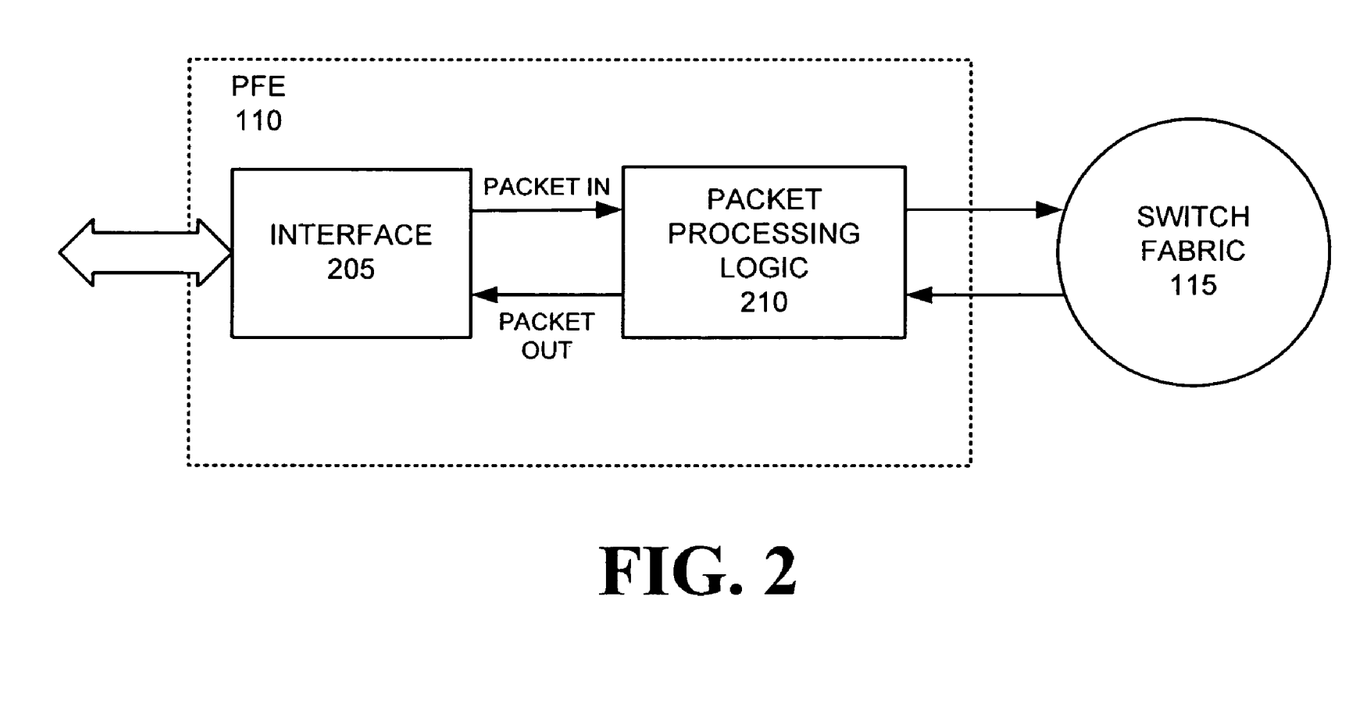
FIG. 2 is an exemplary diagram of a packet forwarding engine according to an implementation consistent with the principles of the invention.

FIG. 2 is an exemplary diagram of a PFE 110 according to an implementation consistent with the principles of the invention. PFE 110 may include an interface 205 and packet processing logic 210. Interface 205 connects to the WAN physical links (not shown). Packet processing logic 210 may process packets received from the WAN links and prepare packets for transmission on the WAN links. For packets received from the WAN, packet processing logic 210 may strip the Layer 2 (L2) and Layer 3 (L3) headers from the packets, fragment each of the packets into one or more cells, and pass the cells to switch fabric 115. Switch fabric 115 may deliver the cells to an appropriate output PFE 110. For packets to be transmitted on the WAN, packet processing logic 210 may receive cells from other PFEs 110, via switch fabric 115, and re-packetize the cells before sending the packet out via interface 205.

Exemplary Packet Processing Logic

Figure 3:
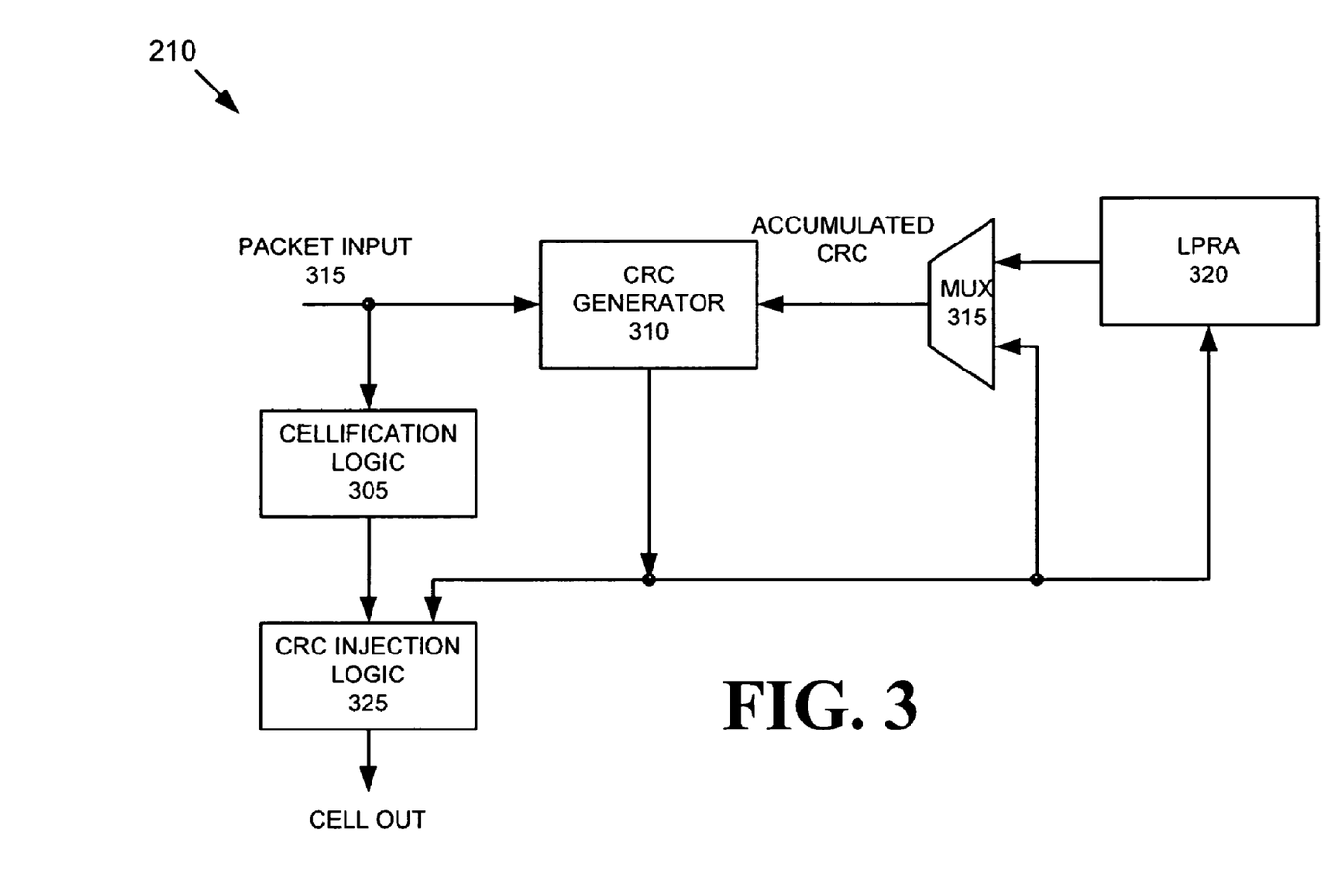
FIGS. 3-4 are exemplary diagrams of packet processing logic according to an implementation consistent with principles of the invention.
Figure 4:
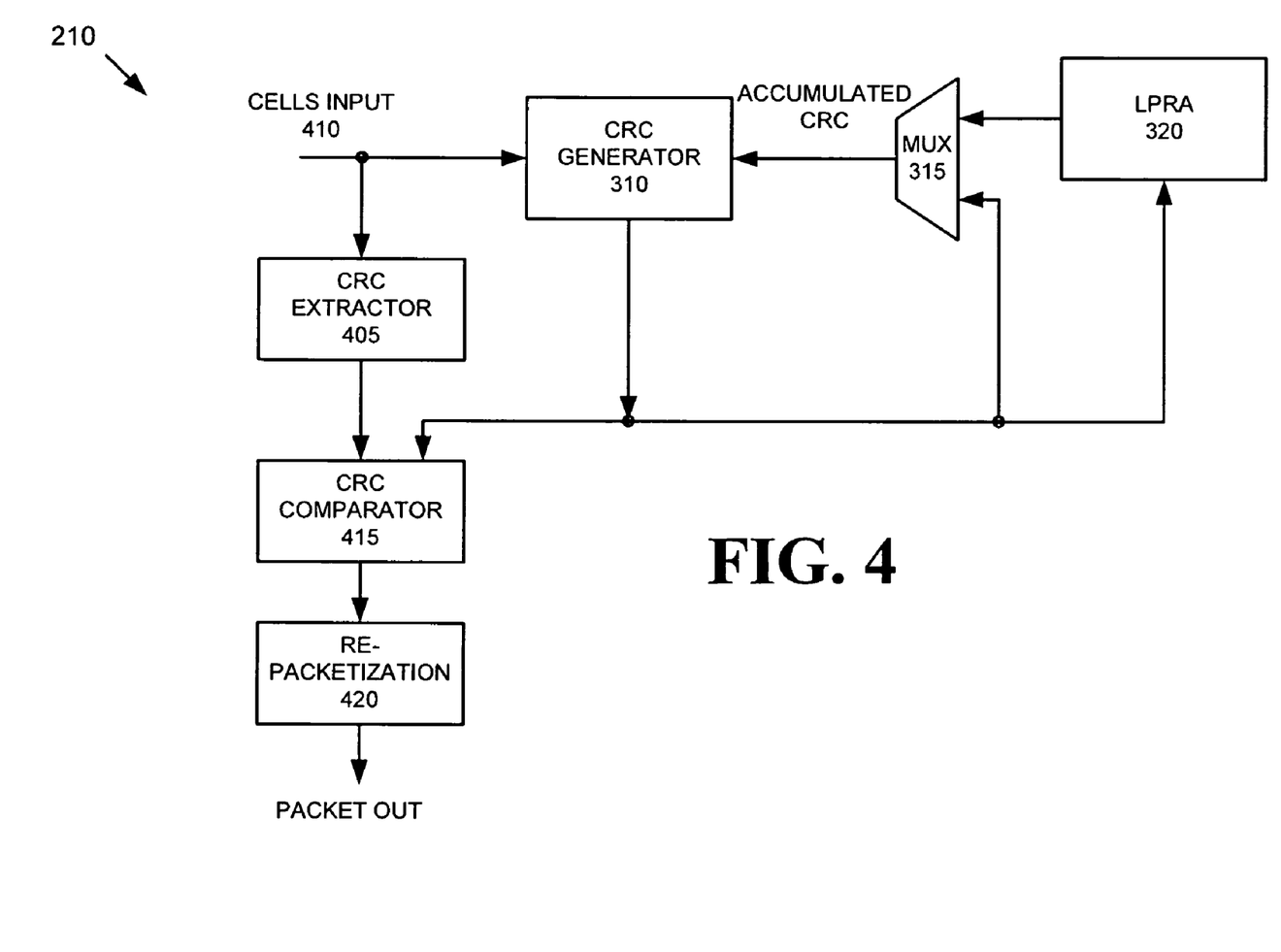

FIGS. 3-4 are exemplary diagrams of packet processing logic 210 according to an implementation consistent with principles of the invention. FIG. 3 illustrates components of packet processing logic 210 for fragmenting an incoming packet, generating a cyclic redundancy check (CRC) checksum, and injecting the checksum into cell overhead or pad bytes. FIG. 4 illustrates components of packet processing logic 210 for extracting an injected CRC checksum from cells and determining whether an error exists in the packet that includes the cells based on the extracted checksum.

As illustrated in FIG. 3, packet processing logic 210 may include packet cellification logic 305 and a CRC generator 310 that each receive incoming packets via packet input line 315. Cellification logic 305 may fragment each incoming packet into one or more fixed length cells (e.g., 64 bytes in length). CRC generator 310 may generate a CRC checksum for each received packet. CRC generator 310 may use, for example, the 16 bit CRC generator polynomial $1+x^5+x^{12}+x^{16}$. One skilled in the art, however, will recognize that other CRC generator polynomials and other types of checksums may alternatively be used. Packet processing logic 210 may further include a multiplexer 315 and a low power register array (LPRA) 320 for accumulating generated CRC checksums. Packet processing logic 210 may additionally include CRC injection logic 325 that injects, or "stuffs," a generated CRC checksum into a cell. For example, the CRC checksum may be stuffed into existing and unused overhead or pad bytes of a cell of a fragmented packet. Overhead bytes may be introduced when variable length packets are fragmented into one or more fixed length cells, thus, producing unused "overhead" bytes in a last cell containing a portion of the fragmented packet. Pad bytes may include "useless" data that exist in incoming packets to router 100. Pad bytes may, for example, be introduced by errors in other routers, or due to certain protocols. As an example, the minimum packet size in Ethernet is 64 bytes, so a packet less than 64 bytes that must traverse an Ethernet must be padded to reach the 64 bytes. Pad bytes, thus, may already be present in packets that are received at router 100.

As illustrated in FIG. 4, packet processing logic 210 may further include a CRC extractor 405 that receive incoming cells via cells input line 410. CRC generator 310 may also receive incoming cells via cell input line 410. CRC extractor 405 may extract any CRC checksum that has been injected into incoming cells. Packet processing logic 210 may also include a CRC comparator 415 and re-packetization logic 420. CRC comparator 415 may include logic for comparing the CRC checksum extracted by CRC extractor 405 with a CRC checksum generated by CRC generator 310 to determine packet errors. Re-packetization logic 420 may re-packetize the cells received via cells input line 410.

Exemplary Checksum Injection Process

Figure 5:
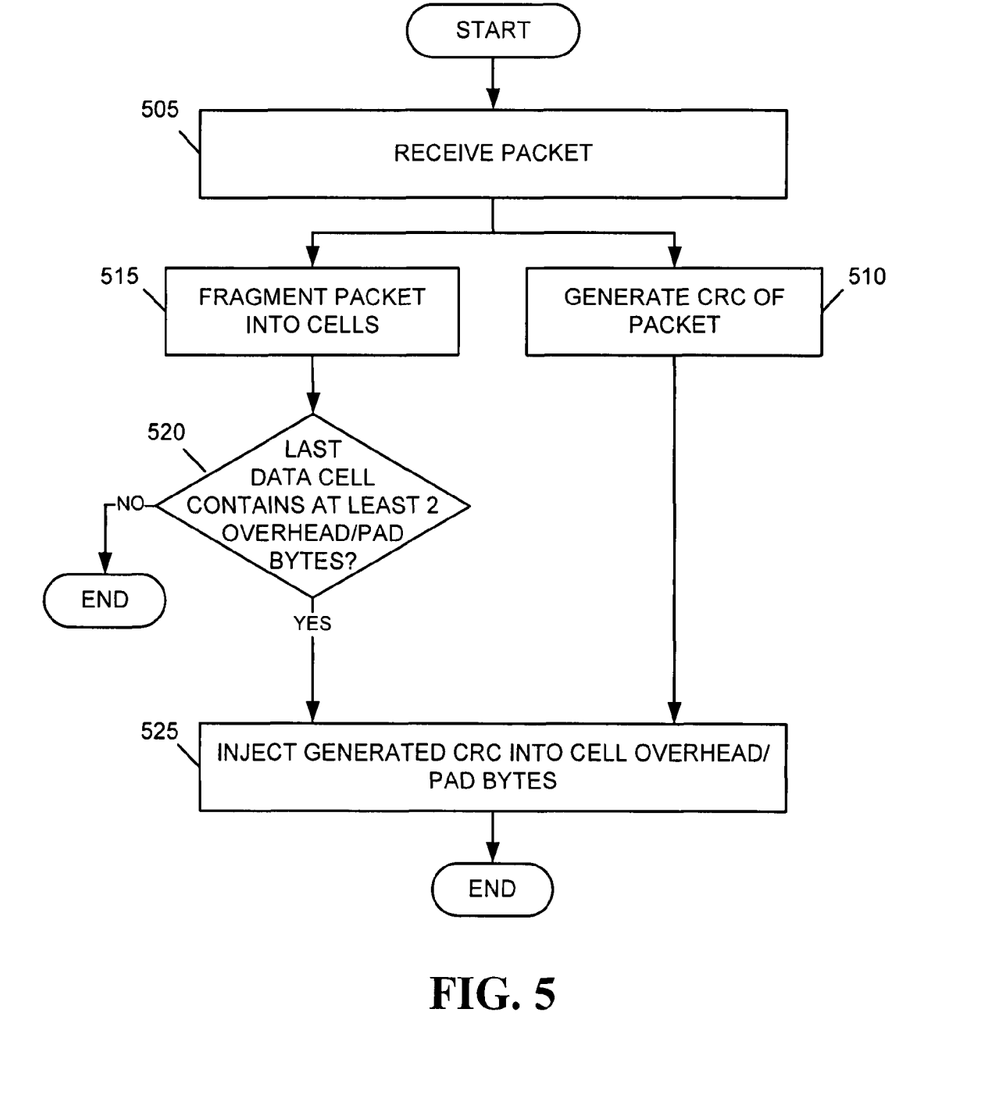
FIG. 5 is a flowchart of an exemplary process for injecting a checksum into cell overhead/pad bytes according to an implementation consistent with principles of the invention.
Figure 7:
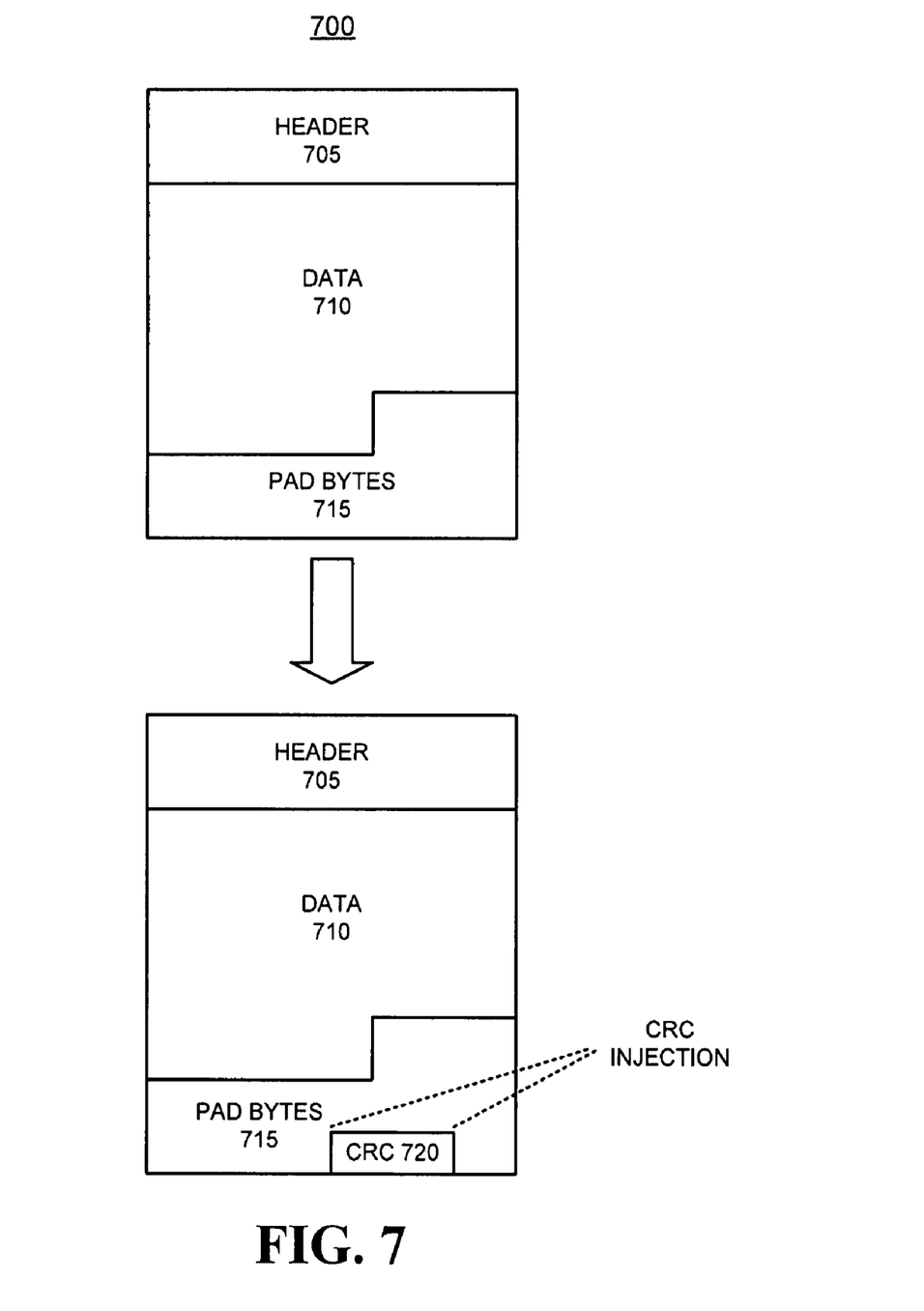
FIG. 7 is an exemplary diagram of a cell with an error detection code inserted into pad bytes according to an implementation consistent with the principles of the invention.

FIG. 5 is a flowchart of an exemplary process for generating and injecting CRC checksums into cells, such as into unused cell overhead or pad bytes of cells that constitute a fragmented packet. The exemplary process may begin with the reception of an incoming packet at an interface 205 of a PFE 110 of router 100 [act 505]. Interface 205 may pass the packet on to packet processing logic 210 which may generate a CRC value of the packet [act 510]. CRC generator 310 of packet processing logic 210 may use a CRC generator polynomial, such as, for example, the polynomial $1+x^5+x^{12}+x^{16}$, for generating the CRC value. The received packet may further be fragmented into one or more cells by cellification logic 305 [act 515]. The cells may, for example, include fixed length cells (e.g., 64 bytes/cell). Since each received packet may be variable in size, fragmentation of each packet into one or more fixed length cells may, thus, produce a final cell that contains one or more overhead bytes that are necessary to fill up the cell. For example, as shown in FIG. 7, a final cell 700 may include a header 705, data 710, and pad bytes 715.

CRC injection logic 325 may determine whether a last cell of the fragmented packet contains, for example, at least two unused pad or overhead byes [act 520]. This determination may additionally include a determination of whether the unused pad or overhead bytes contain a sufficient number of bytes to store the generated CRC (e.g., 2 bytes). If the last cell contains a sufficient number of unused pad or overhead bytes, the generated CRC value may then be injected, or "stuffed," into a location within the overhead or pad bytes [act 525]. For example, FIG. 7 illustrates CRC bytes 720 injected into pad bytes 715 of cell 700. CRC injection logic 325 may, for example, "stuff" the generated CRC value into the unused overhead or pad bytes. This injected CRC value may subsequently be used by packet processing logic 210 in the outgoing PFE 110 to determine whether any corruption of packet data has occurred during the packet forwarding process, as described in more detail below.

Exemplary Checksum Extraction Process

Figure 6:
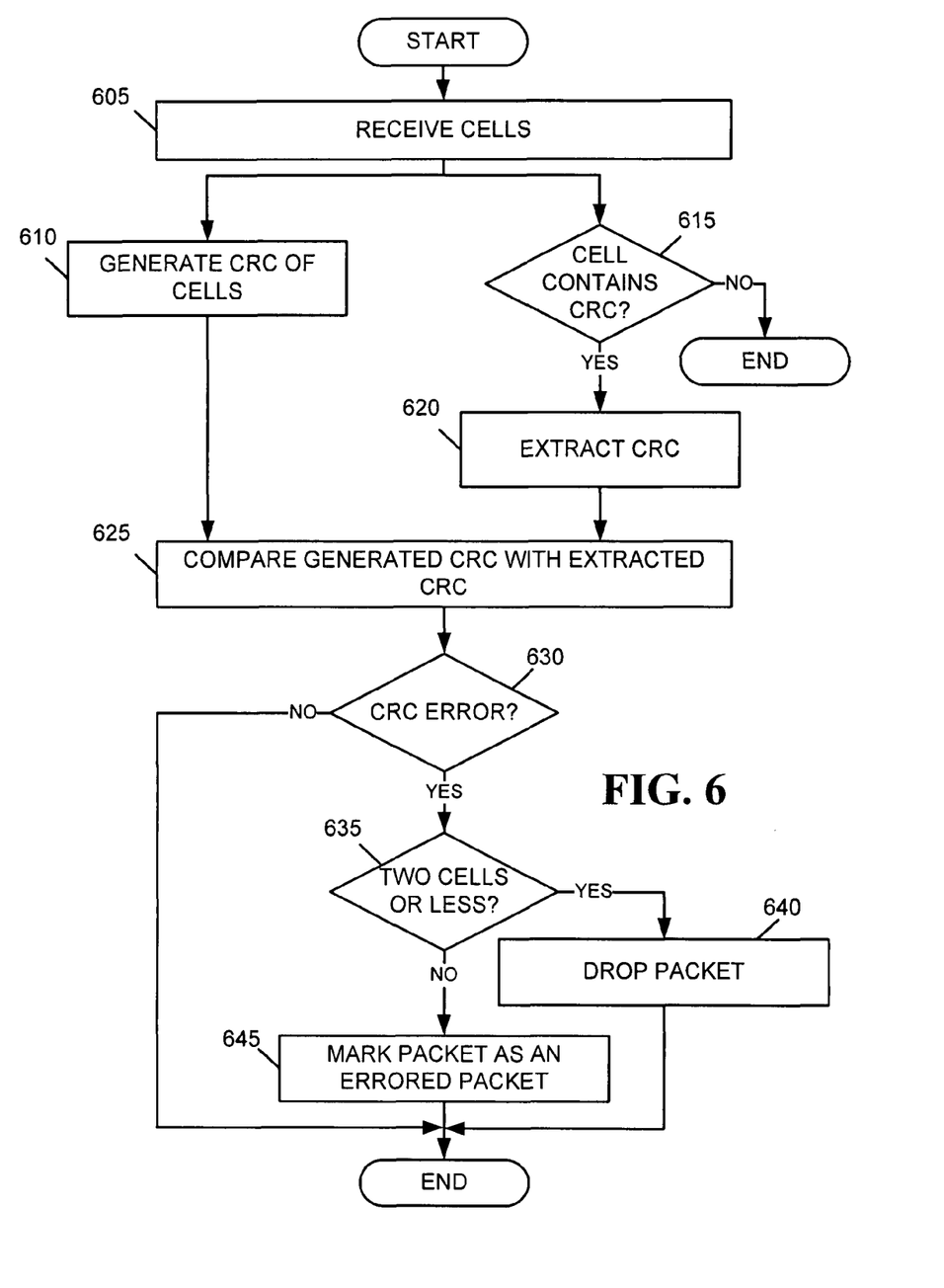
FIG. 6 is a flowchart of an exemplary process for extracting a checksum from cell overhead/pad bytes and detecting packet errors according to an implementation consistent with principles of the invention.

FIG. 6 is a flowchart of an exemplary process for extracting CRC checksums injected into cells and determining whether packet data errors exist according to an implementation consistent with principles of the invention. The process may begin with the reception of one or more cells containing a packet at packet processing logic 210 of an outgoing PFE 110 [act 605]. A CRC of the one or more received cells may then be generated using, for example, a CRC generator polynomial [act 610]. CRC generator 310 may, for example, generate the CRC. CRC extractor 405 may determine whether a cell of the one or more cells contains a CRC value [act 615]. If so, the CRC value may be extracted from the cell [act 620].

CRC comparator 415 may compare the recently generated CRC with the extracted CRC [act 625] to determine whether error has been introduced in the packet data [act 630]. If an error is indicated by the CRC comparison (i.e., the CRC values are not the same), a determination may be made whether the fragmented packet includes two or less cells [act 635]. If so, the packet may be dropped [act 640]. If not, the packet may be marked as errored [act 645] and the packet may be forwarded via interface 205.

CONCLUSION

Consistent with the principles of the present invention, an end-to-end error detection process may be implemented on incoming data received at a network device, such as a router. During the end-to-end error detection process, a network device can detect data errors that may occur when forwarding the data from an input port/interface to an output port/interface of the network device. The end-to-end error detection process may inject, or "stuff," a generated checksum into non-data bytes, such as overhead or pad bytes that may be transferred with the data through the network device. Thus, since no additional error detection bytes must be added for the end-to-end error detection process, no additional demands on available bandwidth are required. In a packet-based system, for example, the complex data manipulation actions necessary for forwarding received packets from an input port/interface to an output port/interface may, therefore, enable error detection to be performed without increasing internal bandwidth requirements of existing network devices. Furthermore, computation of the CRC values and CRC "stuffing" consistent with the principles of the invention may occur on the fly without introducing any added latency. The computed CRC additionally is only computed on packet data bytes that will traverse through the forwarding path of the router to an output (e.g., framing words, notification bytes and pad bytes not included in the CRC computation).

The foregoing description of preferred embodiments of the present invention provides illustration and description, but is not intended to be exhaustive or to limit the invention to the precise form disclosed. Modifications and variations are possible in light of the above teachings or may be acquired from practice of the invention. While a series of acts has been described in FIGS. 5-6, the order of the acts may vary in other implementations consistent with the present invention. Also, non-dependent acts may be performed in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A system, comprising:
 a network device to:
  receive multiple packets, where each of the multiple packets has a variable length,
  generate a first error detection code for one of the received multiple packets,
  divide one of the variable length packets into one or more fixed length cells, where the division produces a cell of the one or more fixed length cells that includes unused overhead bytes that fill up the cell beyond a last portion of the divided one of the variable length packets, selectively insert the first error detection code into the unused overhead bytes, and forward the one or more fixed length cells towards an output of the network device.

2. The system of claim 1, where the network device is further to:

receive the one or more fixed length cells corresponding to the one of the variable length packets, extract the first error detection code from the unused overhead bytes, and check for data errors using the extracted first error detection code.

3. The system of claim 1, where, when selectively inserting the first error detection code into the unused overhead bytes, the network device is further to:

determine whether the unused overhead bytes include a sufficient number of bytes, and insert the first error detection code into the unused overhead bytes based on the determination.

4. The system of claim 3, where the sufficient number of bytes includes at least two bytes.

5. The system of claim 1, where the first error detection code includes a cyclic redundancy check (CRC) value.

6. The system of claim 5, where, when generating the first error detection code, the network device is further to:

use a CRC generator polynomial to generate the CRC value, and where the CRC generator polynomial comprises $1+x^5+x^{12}+x^{16}$.

7. The system of claim 1, where the network device is further to:

receive the one or more fixed length cells corresponding to the one of the variable length packets, generate a second error detection code based on the received one or more fixed length cells, extract the first error detection code from the unused overhead bytes, compare the first error detection code with the second error detection code, and identify data errors based on the comparison.

8. The system of claim 7, where the network device is further to:

drop the one of the variable length packets based on the identification of data errors.

9. The system of claim 7, where the network device is further to:

mark the one of the variable length packets as an error packet based on the identification of data errors.

10. A method, comprising:

receiving, by a network device, multiple packets at an input of the network device, where each of the multiple packets has a variable length;

generating, by the network device, an error code for one of the received multiple packets;

dividing, by the network device, one of the variable length packets into one or more fixed length cells, where the division produces a cell of the one or more fixed length cells that includes unused overhead bytes that fill up the cell beyond a last portion of the divided one of the variable length packets;

selectively, by the network device, inserting the error code into the unused overhead bytes; and transferring, by the network device, the one or more fixed length cells to an output of the network device.

11. A system, comprising:

a network device to:

receive multiple data units at an input of the network device, where each of the multiple data units has a variable length;

generate an error detection code for one of the received multiple data units;

divide one of the variable length data units into one or more fixed length cells, where the division produces a cell of the one or more fixed length cells that includes unused overhead bytes that fill up the cell beyond a last portion of the divided one of the variable length data units;

selectively insert the first error detection code into the overhead bytes; and forward the one or more fixed length cells towards an output of the network device.

12. A system, comprising:

network device; and a processor to:

receive a data unit, determine a first error code based on the received data unit, divide the data unit into one or more fragments, transfer the one or more fragments through the network device to an output, determine a second error code based on the transferred one or more fragments, and compare the first and second error code to identify data errors in the transferred one or more fragments.

13. The system of claim 12, where the data unit includes a packet.

14. The system of claim 12, where each of the one or more fragments includes a fixed length cell.

15. The system of claim 12, where, prior to transferring the data unit through the network device to the output, the network device is further to:

insert the first error code into one of the one or more fragments.

16. The system of claim 15, where, prior to determining the second error code, the network device is further to:

extract the first error code from the one or more fragments, and re-form the data unit from the one or more fragments.

17. The system of claim 12, further comprising:

a switch fabric to facilitate the transfer of the data unit through the network device to the output logic.

18. The system of claim 12, where the network device is further to:

drop the data unit based on the comparison.

19. The system of claim 12, where the network device is further to:

mark the data unit as an error data unit based on the comparison.

* * * * *

UNITED STATES PATENT AND TRADEMARK OFFICE
CERTIFICATE OF CORRECTION

PATENT NO.          : 8,190,966 B1
APPLICATION NO.     : 11/852548
DATED               : May 29, 2012
INVENTOR(S)         : Anjan Venkatramani It is certified that error appears in the above-identified patent and that said Letters Patent is hereby corrected as shown below:

Claim 12, column 8, lines 25-27 should read:

"a network device to:
　　receive a data unit,"

Signed and Sealed this
Twenty-fifth Day of September, 2012

David J. Kappos
*Director of the United States Patent and Trademark Office*